US010871506B1

(12) United States Patent
Chen

(10) Patent No.: US 10,871,506 B1
(45) Date of Patent: Dec. 22, 2020

(54) AUTOMATED KEY PRESSING DEVICE HAVING TWO KEY PRESSING MODULES AND A LOADING STAGE

(71) Applicant: Quanta Computer Inc., Taoyuan (TW)

(72) Inventor: Jeng-Jiun Chen, Taoyuan (TW)

(73) Assignee: Quanta Computer Inc., Taoyuan (TW)

( * ) Notice: Subject to any disclaimer, the term of this patent is extended or adjusted under 35 U.S.C. 154(b) by 0 days.

(21) Appl. No.: 16/567,110

(22) Filed: Sep. 11, 2019

(30) Foreign Application Priority Data

Jun. 24, 2019 (TW) .............................. 108122016 A

(51) Int. Cl.
*G01R 1/02* (2006.01)
*G01R 31/28* (2006.01)
*G01M 99/00* (2011.01)
*G06F 11/273* (2006.01)

(52) U.S. Cl.
CPC .............. *G01R 1/025* (2013.01); *G01M 99/00* (2013.01); *G01R 31/2834* (2013.01); *G06F 11/2736* (2013.01)

(58) Field of Classification Search
CPC ............ G01R 31/2834; G01R 31/2601; G01R 31/2868; G01R 1/025; G01M 19/00; G01N 3/32; G06F 11/22; G06F 11/2205; G06F 11/2376
See application file for complete search history.

(56) References Cited

U.S. PATENT DOCUMENTS

| | | | | |
|---|---|---|---|---|
| 6,304,830 B1* | 10/2001 | Lee | ...................... | G01M 99/008 340/301 |
| 6,314,825 B1* | 11/2001 | Fan | ...................... | G01M 99/008 73/865.3 |
| 6,581,483 B1* | 6/2003 | Yeh | ...................... | G01M 99/007 73/865.3 |
| 8,099,253 B1* | 1/2012 | Rau | ...................... | G06F 21/316 702/113 |
| 9,417,980 B1* | 8/2016 | Chang | ................... | G06F 11/2733 |
| 2008/0257058 A1* | 10/2008 | Chiu | .................... | G01M 99/007 73/818 |
| 2012/0198948 A1* | 8/2012 | Huang | ................ | G01M 99/008 73/865.3 |
| 2012/0266021 A1* | 10/2012 | Tian | ..................... | G06F 11/2733 714/27 |
| 2014/0283629 A1* | 9/2014 | Chu | ..................... | G06F 11/2221 73/865.3 |

(Continued)

FOREIGN PATENT DOCUMENTS

| CN | 103777101 A | * | 5/2014 | ............. G01R 31/00 |
|---|---|---|---|---|
| CN | 207623479 U | * | 7/2018 | ........... G01R 31/327 |

*Primary Examiner* — Darlene M Ritchie

(57) ABSTRACT

An automated key pressing device includes a loading stage, a base, a transmission module, two key pressing modules. The base is located at one side of the loading stage. The transmission module is reciprocatedly slidable on the base. One of the key pressing modules is disposed on the transmission module, and extends outwardly towards the loading stage for pressing one key of a keyboard by the transmission module. The other key pressing module is located on the base and extends outwardly towards the loading stage for pressing another key of the keyboard. The one of the key pressing modules is more prominently extended outwardly than the other. The control unit electrically connected to the key pressing modules and the transmission module.

13 Claims, 9 Drawing Sheets

(56) References Cited

U.S. PATENT DOCUMENTS

2014/0305231 A1* 10/2014 Chu .................... G01M 99/007
                                                            73/865.3
2014/0345395 A1* 11/2014 Wang .................... H05K 13/00
                                                            73/863.01

* cited by examiner

AUTOMATED KEY PRESSING DEVICE HAVING TWO KEY PRESSING MODULES AND A LOADING STAGE

RELATED APPLICATIONS

This application claims priority to Taiwan Application Serial Number 108122016, filed Jun. 24, 2019, which is herein incorporated by reference.

BACKGROUND

Field of Disclosure

The disclosure relates to a key pressing device. More particularly, the disclosure relates to an automated key pressing device.

Description of Related Art

In a verity of current testing procedures of computer products, when executing a specific test program, the test program is allowed to be performed subsequent test procedures by pressing down the specific keys on the keyboard of the computer product one by one.

However, since a specific program is needed to be interacted with an operator, after the test program sends a notification message, waiting for the operator to press down a specific key not only can be error-prone, extended labor hours, but also does not help to increase the degrees of the test process automation.

SUMMARY

In one embodiment of the disclosure, an automated key pressing device which is provided includes a loading stage, a base, a transmission module, at least one first key pressing module and at least one second key pressing module. The loading stage is capable of loading a keyboard of an electronic device. The base is located at one side of the loading stage. The transmission module is reciprocatedly slidable on the base. The first key pressing module is disposed on the transmission module, and extends outwardly towards the loading stage from the transmission module for pressing down one of keys of the keyboard. The second key pressing module is disposed on the base, and extends outwardly towards the loading stage from the base for pressing down another of the keys of the keyboard. The control unit is electrically connected to the first key pressing module, the second key pressing module and the transmission module. Comparing to the second key pressing module, the first key pressing module is more prominently extended above the loading stage.

According to one or more embodiments of the disclosure, in the automated key pressing device, the first key pressing module includes a pivoting base, an extending arm, an electromagnetic component and an elastic member. The pivoting base is located on the transmission module. The extending arm is pivotally connected to the pivoting base, and one end of the extending arm is formed with a key pressing portion. The electromagnetic component is disposed between the pivoting base and the extending arm, and electrically connected to the control unit for switchably magnetically attracting the extending arm. The elastic member is connected to the pivoting base and the extending arm. Thus, when the electromagnetic component magnetically attracts the extending arm to rotate the extending arm, the extending arm presses down the key of the keyboard through the key pressing portion.

According to one or more embodiments of the disclosure, in the automated key pressing device, the first key pressing module includes a servo motor, a rod and a cam. The servo motor is located on the transmission module, and electrically connected to the control unit. The rod is coaxially coupled to a rotary shaft of the servo motor. The cam is coaxially connected to the rod for pressing down the key of the keyboard by the driving of the servo motor.

According to one or more embodiments of the disclosure, in the automated key pressing device, the cam includes a main body and a protrusive portion. The main body is coaxially coupled to the rod. The protrusive portion is formed on a circumferential surface of the main body. When the servo motor rotates the cam by one of different rotation angles, the cam is rotated to press down the key through one of the main body and the protrusive portion such that the key is pressed down by one of two different declining distances.

According to one or more embodiments of the disclosure, in the automated key pressing device, the transmission module includes two platforms, two pulleys, at least one guiding post, a carrier, a moving belt and a step motor. The platforms are located oppositely on the base. The pulleys are respectively pivoted on the platforms. The guiding post is located between the platforms and disposed across the platforms. The carrier is slidably disposed on the guiding post for carrying the at least one first key pressing module. The moving belt is sleeved on the pulleys, and fixedly connected to the carrier for traveling with the rotation of the pulleys. The step motor is coaxially connected to one of the pulleys and electrically connected to the control unit for reciprocating the carrier.

According to one or more embodiments of the disclosure, in the automated key pressing device, the second key pressing module is plural, and the second key pressing modules are fixedly arranged abreast on the base for pressing down a few of the keys of a same key row of the keyboard, respectively.

According to one or more embodiments of the disclosure, in the automated key pressing device, the automated key pressing device further includes at least one third key pressing module. The third key pressing module is disposed on the base, and extends outwardly towards the loading stage from the base in a first direction for pressing down one another of the keys of the keyboard. Both of the first key pressing module and the second key pressing module extend towards the loading stage in a second direction which is intersected with the first direction.

According to one or more embodiments of the disclosure, the automated key pressing device further includes a support bracket and an image capturing device. The support bracket is connecting the base. The image capturing device is suspended and mounted on the support bracket, and electrically connected to the control unit for capturing images of at least one of a display screen of the electronic device and the keyboard of the electronic device.

According to one or more embodiments of the disclosure, in the automated key pressing device, the loading stage further includes a bottom plate and a moving plate. The bottom plate is formed with a first guiding rail. The moving plate is formed with a second guiding rail for carrying the electronic device. Thus, the moving plate is slidably disposed on the bottom plate through the first guiding rail being slidably engaged with the second guiding rail.

In one embodiment of the disclosure, an automated key pressing device which is provided includes a base, a plurality of key pressing modules and a control unit. The base is provided with a test area for placing a keyboard therein. The keyboard has a plurality of key rows which are parallel to each other. The key pressing modules are arranged abreast on the base along a long axis of the base, and respectively extend outwardly into the test area from the base. Lengths of the key pressing modules extending into the test area are incrementally increased along a direction respectively for pressing down at least different two of the key rows of the keyboard respectively. The control unit is configured to respectively trigger the key pressing modules to press down the keyboard.

Thus, through the construction of the embodiments above, the automated key pressing device is allowed to realize an automatic test of the keyboard for improving the accuracy and efficiency of the test under the premise of reducing labor participation.

The above description is merely used for illustrating the problems to be resolved, the technical methods for resolving the problems and their efficacies, etc. The specific details of the disclosure will be explained in the embodiments below and related drawings.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure. In the drawings.

DESCRIPTION OF THE EMBODIMENTS

Figure 1:
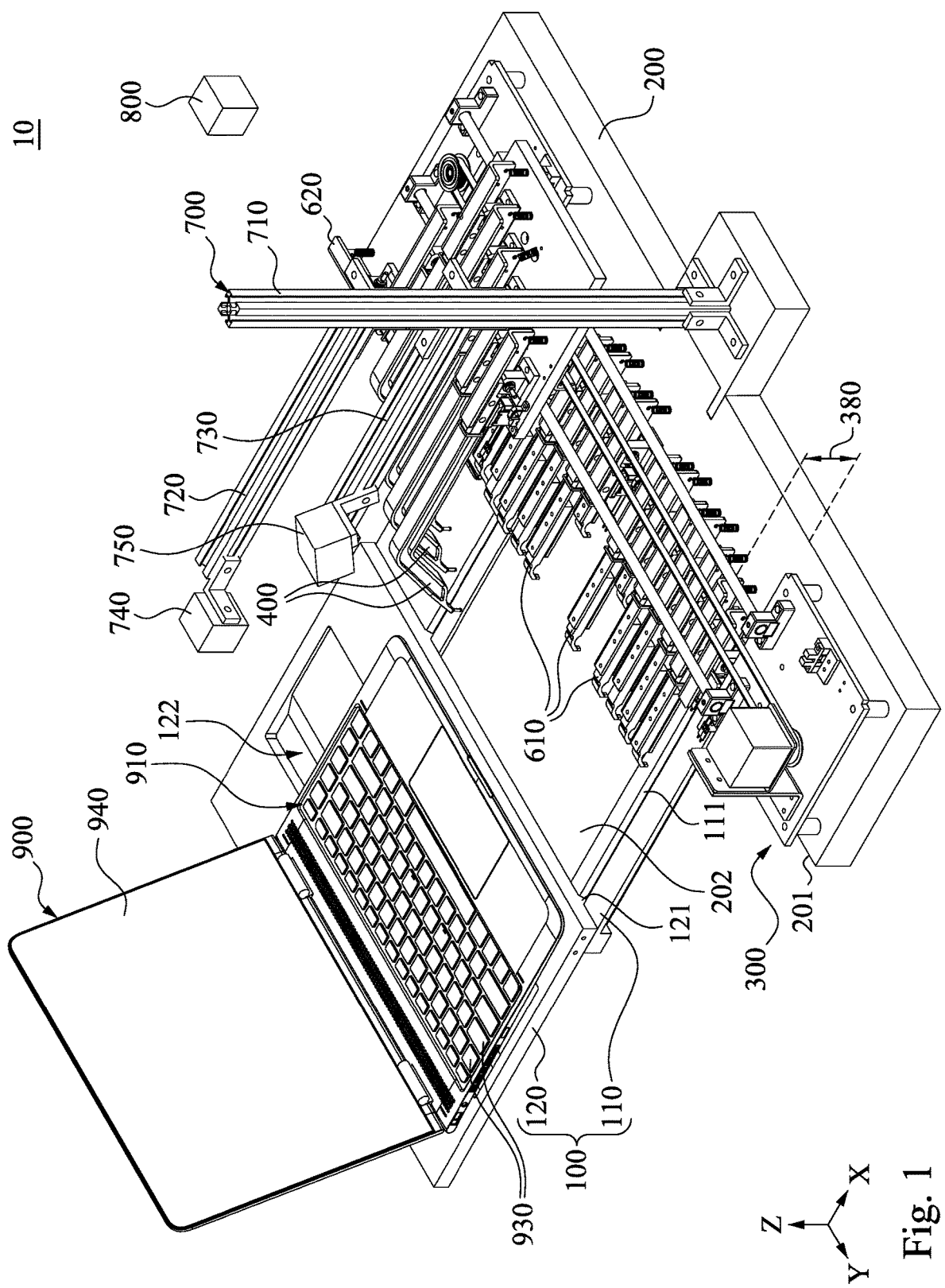
FIG. 1 is a perspective view of an automated key pressing device according to one embodiment of the disclosure.

Reference will now be made in detail to the present embodiments of the disclosure, examples of which are illustrated in the accompanying drawings. Wherever possible, the same reference numbers are used in the drawings and the description to refer to the same or like parts. According to the embodiments, it will be apparent to those skilled in the art that various modifications and variations can be made to the structure of the disclosure without departing from the scope or spirit of the disclosure.

Figure 2:
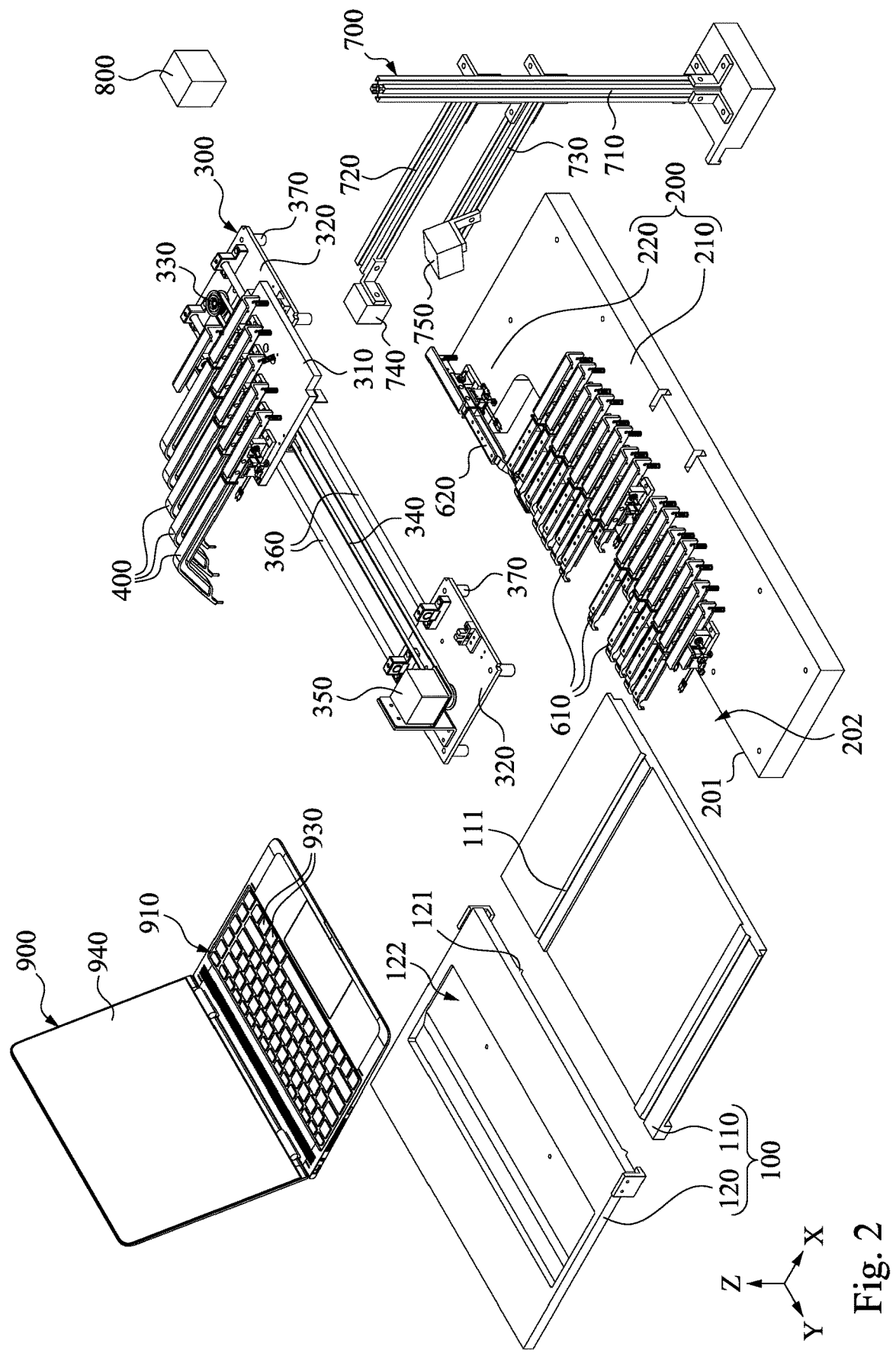
FIG. 2 is an exploded view of the automated key pressing device of FIG. 1.
Figure 3:
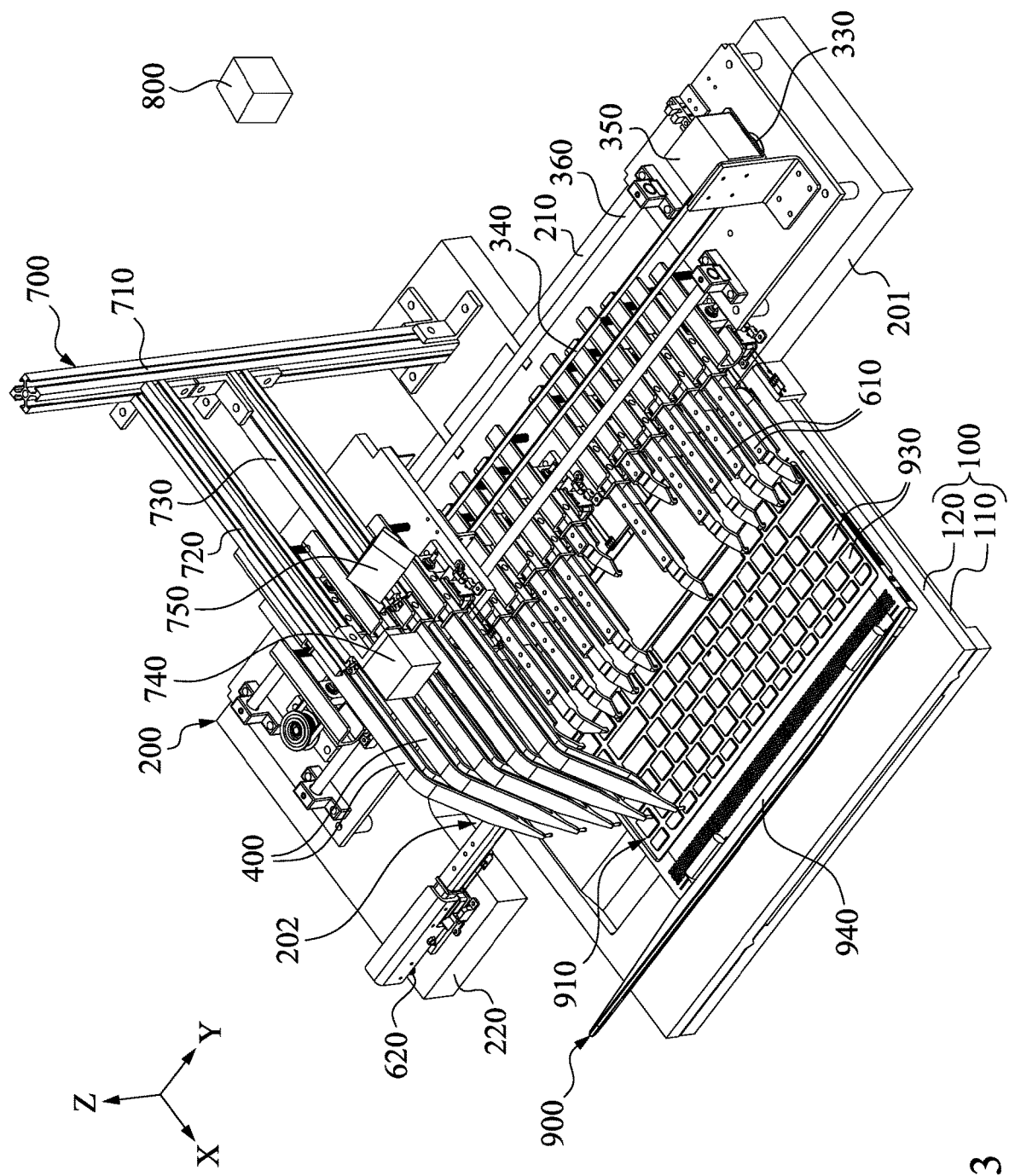
FIG. 3 is a schematic view of the loading stage of FIG. 1 being moved to the test area.

Reference is now made to FIG. 1 to FIG. 3, in which FIG. 1 is a perspective view of an automated key pressing device 10 according to one embodiment of the disclosure, FIG. 2 is an exploded view of the automated key pressing device 10 of FIG. 1, and FIG. 3 is a schematic view of the loading stage 100 of FIG. 1 being moved to a test area 202. As shown in FIG. 1 to FIG. 2, the automated key pressing device 10 includes a loading stage 100, a base 200, a transmission module 300, a plurality of (e.g., 10) first key-pressing (or keystroke) modules 400, a plurality of (e.g., 5) second key-pressing (or keystroke) modules 610 and a control unit 800. The loading stage 100 is capable of loading an electronic device 900, for example, a notebook computer or a keyboard device or the like. One of outer edges 201 of the base 200 is defined with a test area 202 for receiving the electronic device 900 loaded on the loading stage 100. The transmission module 300 is reciprocatedly slidable on the base 200, that is, the transmission module 300 is allowed to reciprocate on the base 200 along a long axis direction (e.g., Y axis) of the base 200. The first key pressing modules 400 are respectively disposed on the transmission module 300 so as to reciprocate on the base 200 by the transmission module 300, respectively. Each of the first key pressing modules 400 extends outwardly towards the test area 202 from the transmission module 300 in a first direction (e.g., X axis) for pressing down one of keys 930 of a keyboard 910 of the electronic device 900 so as to simulate an action of the key 930 of the keyboard 910 being manually pressed by manpower. The second key pressing modules 610 are disposed on the base 200, and sequentially arranged along the outer edge 201 of the base 200. Each of the second key pressing modules 610 extends outwardly towards the test area 202 from the base 200 in the first direction (e.g., X axis) for pressing down another key 930 so as to simulate an action of the another key 930 of the keyboard 910 being manually pressed by manpower. Comparing to the second key pressing module 610, the first key pressing module 400 is more prominently extended above the loading stage 100. The control unit 800 is electrically connected to the first key pressing module 400, the second key pressing module 610 and the transmission module 300, and is used to control the movement of the transmission module 300, and control the first key pressing module 400 and the second key pressing module 610 to press the keyboard 910 of the electronic device 900, respectively.

Therefore, since the first key pressing module 400 is more prominently extended above the loading stage 100 than the second key pressing module 610, when the control unit 800 simultaneously triggers the first key pressing module 400 and the second key pressing module 610, the first key pressing module 400 and the second key pressing module 610 can simultaneously press down keys of different key rows of the keyboard 910.

Thus, through the construction of the embodiments above, the automated key pressing device 10 is allowed to realize an automatic test of the keyboard 910 for improving the accuracy and efficiency of the test under the premise of reducing labor participation.

Specifically, in the embodiment, the first key pressing modules 400 are arranged abreast on the transmission module 300, and the lengths of the first key pressing modules 400 extending into the test area 202 are incrementally increased along the outer edge 201 (e.g., Y axis) of the base 200. Also, the second key pressing modules 610 are fixedly disposed on the base 200, and arranged abreast on the outer edge 201 (e.g., Y axis) of the base 200. The lengths of the second key pressing modules 610 extending into the test area 202 are the same with each other.

Figure 4:
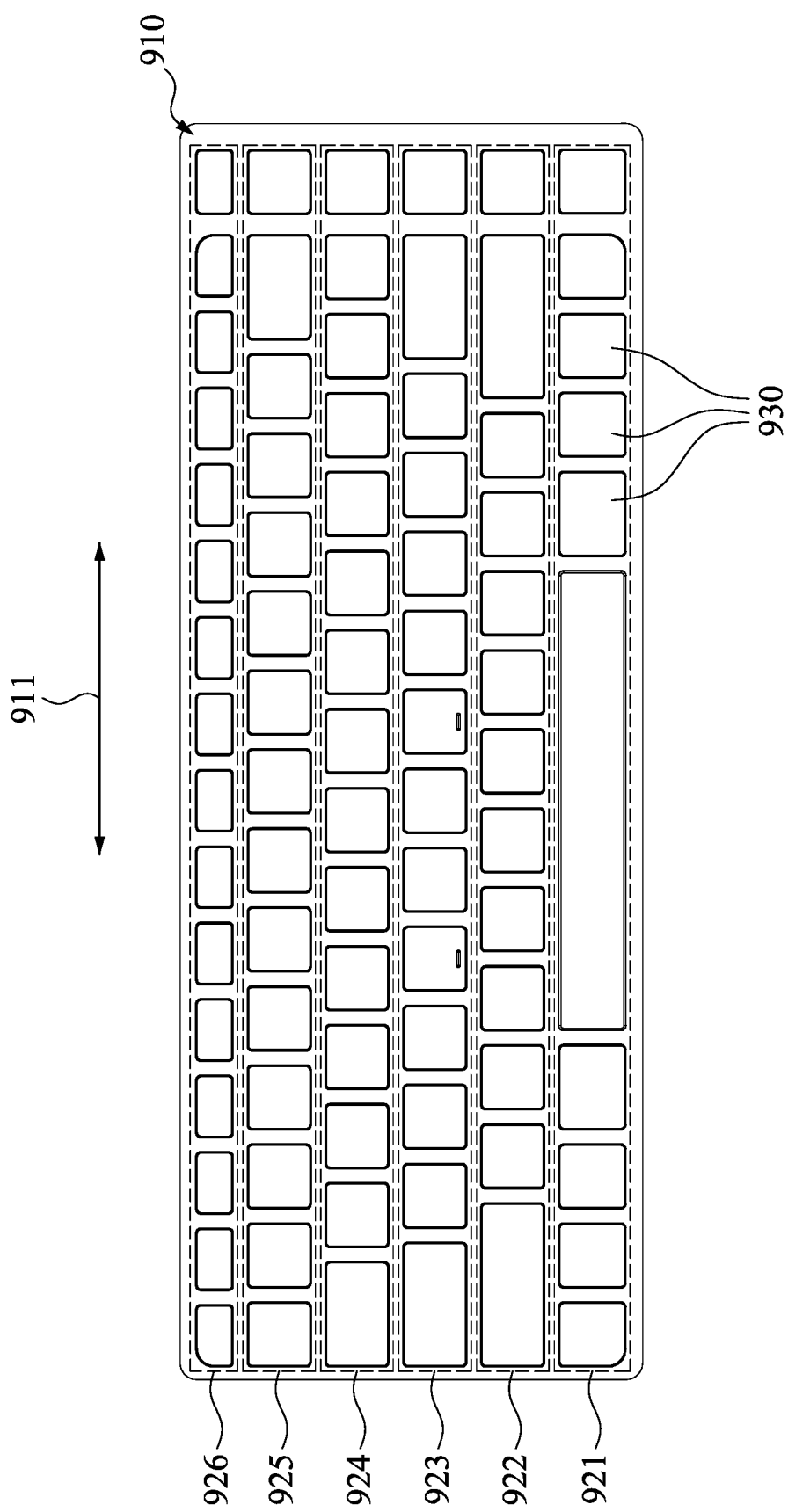
FIG. 4 is a front view of a conventional keyboard.

FIG. 4 is a front view of a conventional keyboard 910. As shown in FIG. 3 and FIG. 4, the conventional keyboard 910 includes a plurality of (e.g., 6) key rows (e.g., a first key row 921, a second key row 922, a third key row 923, a fourth key row 924, a fifth key row 925 and a sixth key row 926). These key rows are parallel to each other. Each of the key rows includes a plurality of keys 930. The keys 930 of each of the key rows are arranged in a single row along a longitudinal direction 911 of the keyboard 910. For example, one of the key rows of the conventional keyboard 910 having a space bar is named as the first key row 921, that is, the outermost one of the key rows, and the rest of the key rows of the conventional keyboard 910 are named as the second key row 922, the third key row 923, the fourth key row 924, the fifth key row 925 and the sixth key row 926 in order.

Thus, when the keyboard 910 is loaded on the loading stage 100, and the loading stage 100 is moved into the test area 202 to accomplish a positioning procedure for the keyboard 910 next to the outer edge 201 of the base 200, since the lengths of the first key pressing modules 400 extending into the test area 202 are incrementally increased, the first key pressing modules 400 respectively reach the second key row 922 to the sixth key row 926 exactly in order, and the second key pressing modules 610 respectively reach the first key row 921 only at the same time, and respectively align with the keys 930 of the first key row 921.

Thus, the control unit 800 can control the transmission module 300 to move, and any of the first key pressing modules 400 to press down the corresponding key 930 of the corresponding key row. The control unit 800 also can control any of the second key pressing modules 610 to press down any of the keys 930 of the first key row 921. As such, the control unit 800 can control one of the first key pressing modules 400 and one of the second key pressing modules 610 to press down any combination of the keys 930 of different key rows simultaneously.

As shown in FIG. 1 to FIG. 2, the automated key pressing device 10 further includes a support bracket 700, a first image capturing device 740 and a second image capturing device 750. The support bracket 700 is connecting the base 200. The first image capturing device 740 and the second image capturing device 750 are suspended and mounted on the support bracket 700, and electrically connected to the control unit 800, respectively. The first image capturing device 740 captures images of the keyboard 910 of the electronic device 900. The second image capturing device 750 captures images of a display screen 940 of the electronic device and the keyboard of the electronic device. More specifically, the support bracket 700 includes a stand 710, a first arm 720 and a second arm 730. The first arm 720 and the second arm 730 are respectively fixed on the stand 710 and extend above the transmission module 300 and the first key pressing modules 400 respectively. The first arm 720 and the second arm 730 are parallel to each other. The stand 710 and the first arm 720 are perpendicular to each other. The first image capturing device 740 is fixedly connected to an end of the first arm 720 facing away from the stand 710 to aim with the keyboard 910 of the electronic device 900. The second image capturing device 750 is fixedly connected to an end of the second arm 730 facing away from the stand 710 to aim with the display screen 940. Thus, the control unit 800 can perform the above-mentioned positioning procedure by returning images of the first image capturing device 740, and determine whether the corresponding key is effectively pressed down by returning images of the second image capturing device 750.

Figure 5:
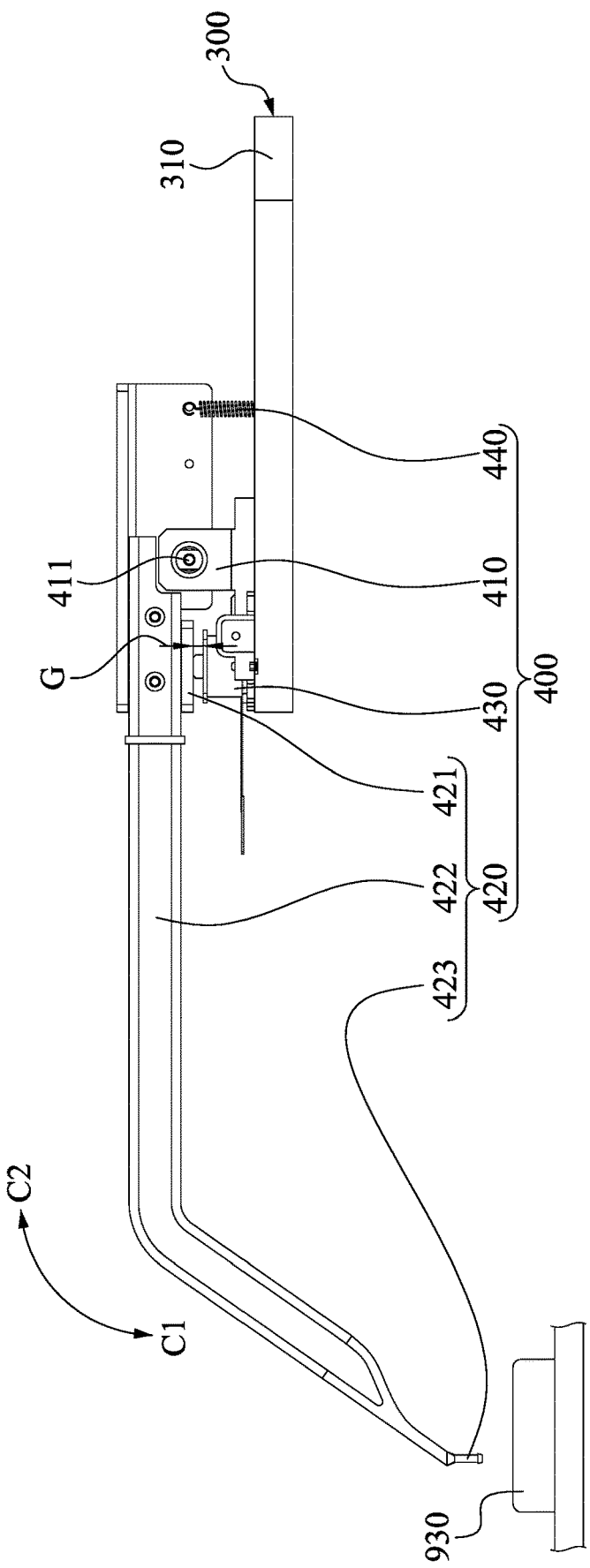
FIG. 5 is a side view of the first key pressing module of FIG. 1.
Figure 6:
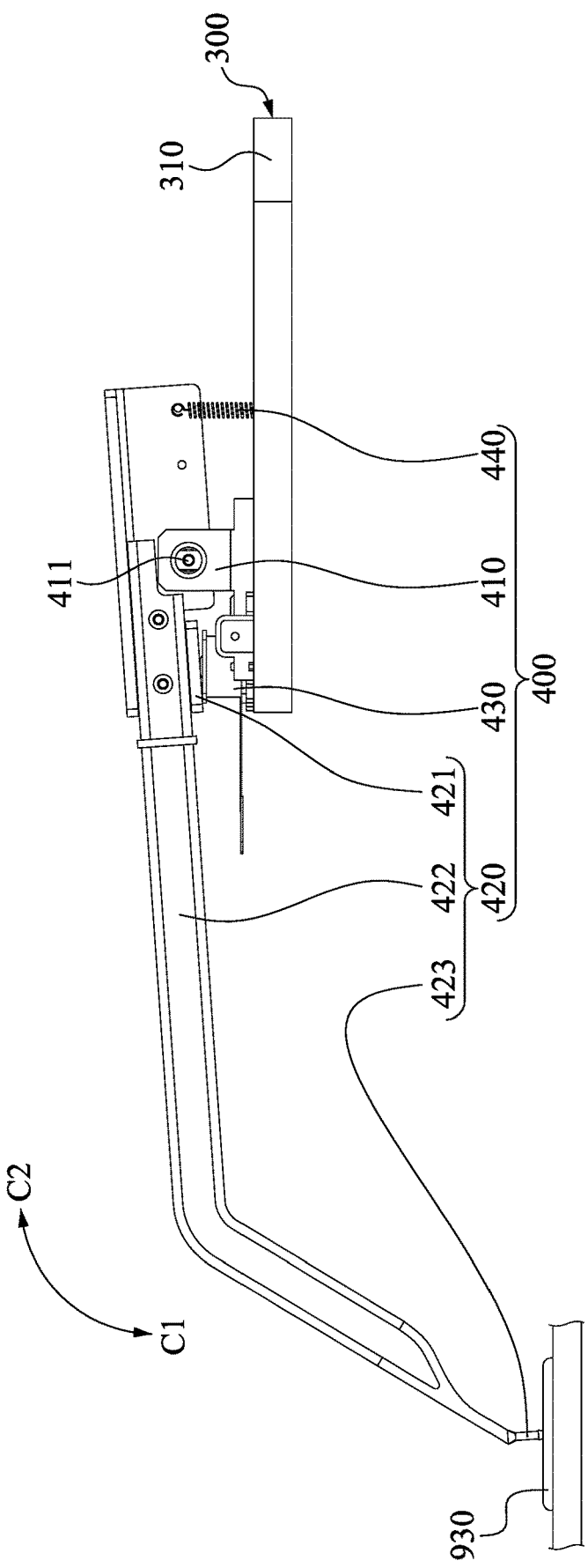
FIG. 6 is an operation view of FIG. 5.

Reference is now made to FIG. 5 and FIG. 6, in which FIG. 5 is a side view of the first key pressing module 400 of FIG. 1. FIG. 6 is an operation view of FIG. 5. As shown in FIG. 5 and FIG. 6, in the automated key pressing device of the embodiment above, the first key pressing module 400 includes a pivoting base 410, an extending arm 420, an electromagnetic component 430 and an elastic member 440. The pivoting base 410 is located on the transmission module 300. The extending arm 420 is pivotally connected to the pivoting base 410, for example, the extending arm 420 is formed with a metal holder 421, a beam 422 and a key pressing portion 423. The metal holder 421 is pivotally connected to the pivoting base 410 through a pivot 411. One end of the beam 422 is sleeved on the metal holder 421, and the key pressing portion 423 which is cylindrical is connected to the other end of the beam 422 of the extending arm 420. The electromagnetic component 430 is disposed between the pivoting base 410 and the extending arm 420, and electrically connected to the control unit 800 (FIG. 1). Thus, the control unit 800 can switchably control the electromagnetic component 430 to magnetically attract the extending arm 420 or not. The electromagnetic component 430 is faced towards the metal holder 421, such that a gap G is formed between the metal holder 421 and the electromagnetic component 430. The elastic member 440 is, for example, a tension spring, and is connected to the pivoting base 410 and the extending arm 420.

Thus, as shown in FIG. 1 and FIG. 6, when the control unit 800 turns on the electromagnetic component 430, the electromagnetic component 430 is triggered to magnetically attract the metal holder 421 of the extending arm 420 such that the extending arm 420 magnetically attracted by the electromagnetic component 430 starts to rotate in a first rotational direction C1 (FIG. 6) until the metal holder 421 arrives to the electromagnetic component 430 towards the gap G. Thus, the extending arm 420 can be moved to press down the aligned key 930 with the key pressing portion 423, and the elastic member 440 is deformed by the extending arm 420 for storing a restore elasticity force. On the other hand, as shown in FIGS. 1 and 5, when the control unit 800 turns off the electromagnetic component 430, the electromagnetic component 430 no longer magnetically attracts the metal holder 421 of the extending arm 420. Accordingly, the restore elasticity force of the elastic member 440 starts to pull the extending arm 420 to rotate in the second rotational direction C2 (FIG. 5) being opposite to the first rotational direction C1 until the extending arm 420 is drawn back to the original position.

Furthermore, in the embodiment, as shown in FIG. 1 and FIG. 6, the automated key pressing device 10 further includes at least one third key-pressing (or keystroke) module 620. The third key pressing module 620 is disposed on the base 200 so as to simulate an action of one another key 930 of the keyboard 910 being manually pressed by manpower. The another key 930 is one of the keys of keyboard 910 which cannot be pressed down by any of the first key pressing modules 400 and any of the second key pressing modules 610. For example, when the keyboard is provided with a numeric key area (not shown), the automated key pressing device 10 can press down any number key of the numeric key area through the third key pressing module 620.

Specifically, as shown in FIG. 1 and FIG. 2, the base 200 is formed with an "L" type, and the base 200 includes a first portion 210 and a second portion 220 in which a major axis direction (e.g., X axis) of the first portion 210 and a major axis direction (e.g., Y axis) of the second portion 220 are orthogonal to each other such that the test area 202 described above can be defined by the first portion 210 and the second portion 220 together. The second key pressing modules 610 are located at the first portion 210 of the base 200. The third key pressing module 620 is located at the second portion 220 of the base 200, and the third key pressing module 620 extends outwardly towards the test area 202 from the second portion 220 of the base 200 in a second direction (e.g., Y axis). The second direction and the first direction are orthogonal to each other, or at least intersected with each other. The disclosure is not limited thereto, in another embodiment, the second key pressing modules 610 and the third key pressing module 620 can also be slidably located on the base 200.

As shown in FIG. 1 and FIG. 2, the loading stage 100 is slidably disposed in the test area 202. Specifically, the loading stage 100 further includes a bottom plate 110 and a moving plate 120. The bottom plate 110 is formed with two first guiding rails 111 which are aligned with the test area 202, respectively. The moving plate 120 is formed with two second guiding rails 121, and is used to carry the electronic device 900. The moving plate 120 is slidably disposed on the bottom plate 110 through the first guiding rails 111 being slidably engaged with the second guiding rails 121, respectively. Therefore, the loading stage 100 can be slid into the test area 202 along a first direction (e.g., X-axis) to allow the keyboard 910 of the electronic device 900 to complete the aforementioned positioning operation.

Since the loading stage 100 can slide along the first direction (e.g., the X axis), the third key pressing module 620 can align to and press down any of the number keys through the sliding of the moving plate 120. The number keys (not shown) of the numeric key area are arranged in the first direction (e.g., X axis). In addition, the moving plate 120 is further formed with a receiving recess 122. The receiving recess 122 is used to fixedly place the electronic device (not shown) such as a keyboard device.

In this embodiment, the structure of each of the second key pressing module 610 and the third key pressing module 620 is the same as that of the first key pressing module 400, thus, the details are not described herein. However, the disclosure is not limited that the first key pressing module 400, the second key pressing module 610 and the third key pressing module 620 must be the same in structure.

As shown in FIG. 2 and FIG. 3, in the embodiment, the transmission module 300 includes a carrier 310, two platforms 320, two pulleys 330, a moving belt 340, a step motor 350 and a guiding post 360. The platforms 320 are located oppositely on the base 200. The pulleys 330 are respectively pivoted on the platforms 320. The guiding post 360 is located between the platforms 320 to be disposed across the platforms 320. The carrier 310 is slidably disposed on the guiding post 360 for carrying the first key pressing modules 400. The moving belt 340 is sleeved on the pulleys 330, and fixedly connected to the carrier 310 for traveling with the rotation of the pulleys 330. The step motor 350 is coaxially connected to one of the pulleys 330 and electrically connected to the control unit 800 for reciprocating the carrier 310. Thus, by controlling the specific rotational amplitude of the step motor 350 (e.g., revolution angles), the control unit 800 can accurately position the particular first key pressing module 400 to a desired position.

An interval space 380 is kept between the transmission module 300 and the base 200 such that the second key pressing modules 610 are allowed to be arranged in the interval space 380 so as to properly use the total space. For example, the platform 320 is separated from the base 200 by partitioning columns 370 such that the interval space 380 can be formed between the transmission module 300 and the base 200, that is, the interval space 380 is formed between the guiding post 360 and the base 200. However, the disclosure is not limited thereto.

Figure 7:
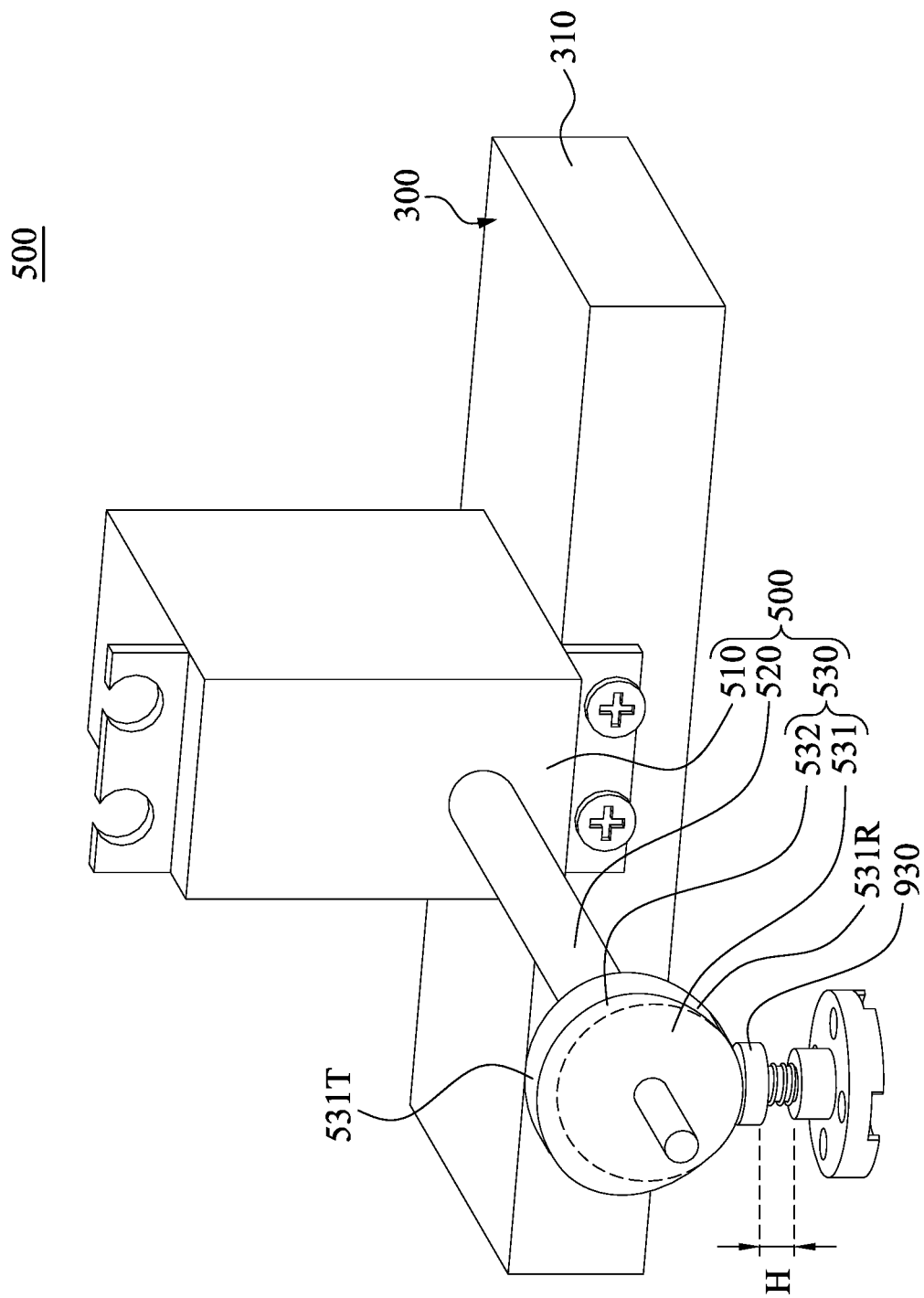
FIG. 7 is a perspective view of a first key pressing module according to one embodiment of the disclosure.
Figure 8:
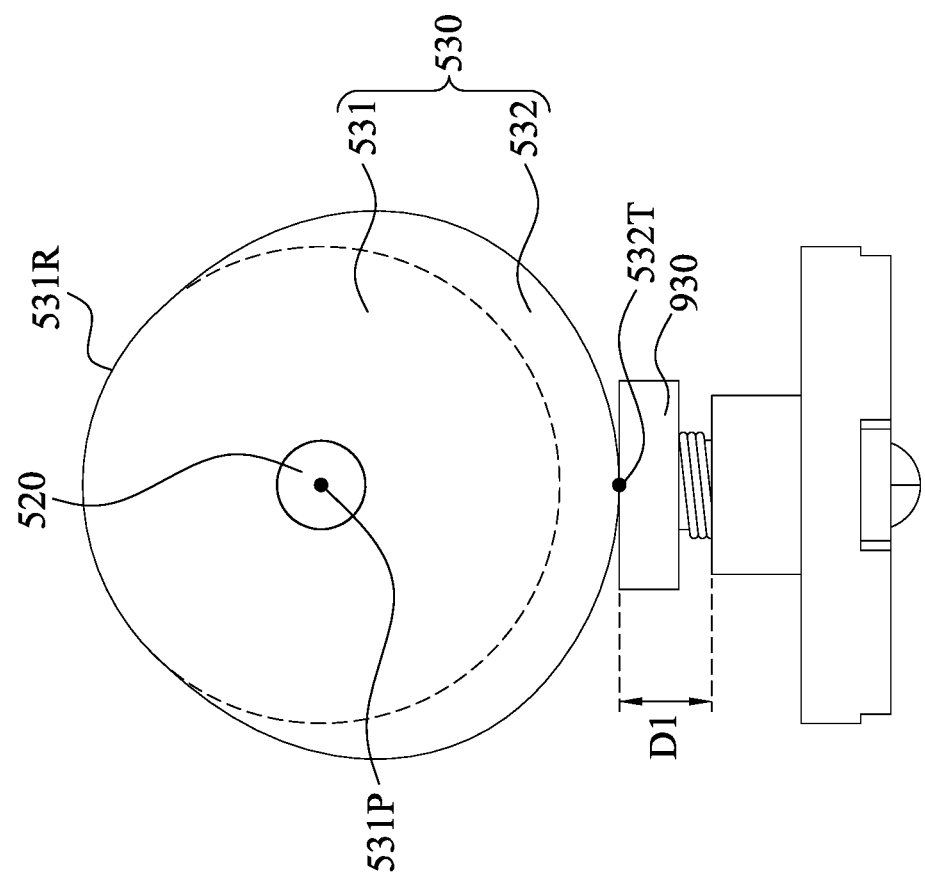
FIG. 8 is an operation view of a key being pressed down by the first key pressing module of FIG. 7.

Reference is now made to FIG. 7 and FIG. 8, in which FIG. 7 is a perspective view of a first key pressing module 500 according to one embodiment of the disclosure, and FIG. 8 is an operation view of a key 930 being pressed down by the first key pressing module 500 of FIG. 7. As shown in FIG. 7, in the embodiment, the first key pressing module 500 includes a servo motor 510, a rod 520 and a cam 530. The servo motor 510 is located on the transmission module 300, and electrically connected to the control unit 800. The rod 520 is coaxially coupled to a rotary shaft of the servo motor 510. The cam 530 is coaxially connected to the rod 520 for pressing down a key 930 by the driving of the servo motor 510. The first key pressing module 500 presses down the key 930 through the rotating cam 530. At this time, the key 930 not been pressed down yet has a height H. More particularly, the cam 530 includes a main body 531 and a protrusive portion 532. The main body 531 is coaxially coupled to the rod 520. The protrusive portion 532 is protrusively formed on a circumferential surface 531R of the main body 531 and is monolithically formed with the main body 531.

Thus, as shown in FIG. 1 and FIG. 8, when the control unit 800 turns on the servo motor 510 such that the servo motor 510 coaxially rotates the rod 520 and the cam 530, the first key pressing module 500 presses the key 930 through the protrusive portion 532 of the cam 530. Specifically, when the control unit 800 instructs the servo motor 510 to rotate the cam 530 by a first rotation angle, the cam 530 presses down the key 930 through the apex 532T of the protrusive portion 532. At this moment, the key 930 which has been pressed down has a first height D1, and the declining distance of the key 930 which is effectively pressed down by the apex 532T of the protrusive portion 532 is the maximum declining distance.

In this embodiment, the structure of each of the second key pressing module 610 and the third key pressing module 620 is the same as that of the first key pressing module 500, thus, the details are not described herein. However, the disclosure is not limited that the first key pressing module 500, the second key pressing module 610 and the third key pressing module 620 must be the same in structure.

Figure 9:
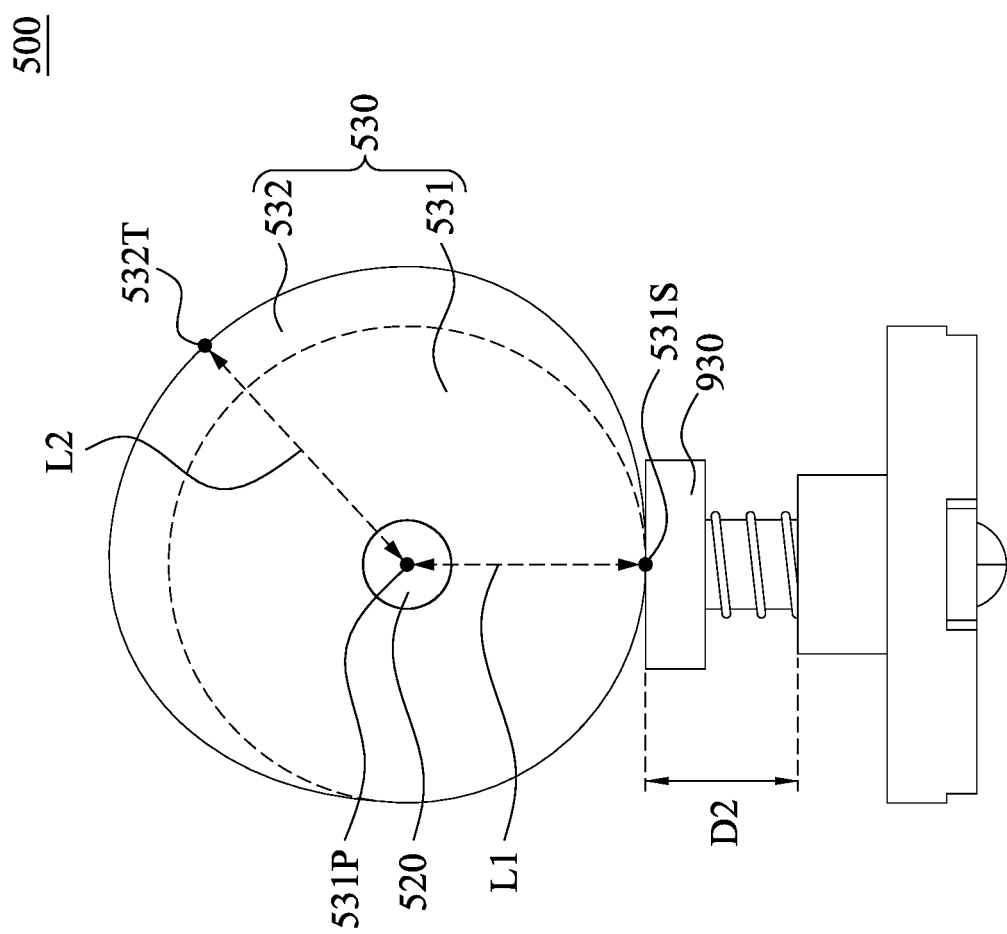
FIG. 9 is another operation view of a key being pressed down by the first key pressing module of FIG. 7.

FIG. 9 is another operation view of a key 930 being pressed down by the first key pressing module 500 of FIG. 7. As shown in FIG. 7 and FIG. 9, in different style keyboards, since declining distances of the keys 930 being effectively pressed down may be different, thus, the servo motor 510 can be instructed to selectively rotate the cam 530 by one of different rotation angles, thus, the key 930 can be pressed down by different positions of the cam 530 such that the key 930 can be pressed in different declining distances.

For example, when the control unit 800 instructs the servo motor 510 to rotate the cam 530 by a second rotation angle, the cam 530 presses down the key 930 through a predetermined position 531S of the main body 531 of the protrusive portion 532. At this moment, the key 930 which has been pressed down lefts a second height D2. A minimum straight length L1 formed between the predetermined position 531S of the protrusive portion 532 and a center point 531P of the main body 531 is smaller than a minimum straight length L2 formed between the apex 532T of the protrusive portion 532 and the center point 531P of the main body 531. Thus, the second height D2 of the key 930 is greater than the first height D1 of the key 930, on the other words, a declining distance of the key 930 being effectively pressed down through the predetermined position 531S of the protrusive portion 532 is less than a declining distance of the key 930 being effectively pressed down through the apex 532T of the cam 530.

It is noted, the above-mentioned control unit 800 is a hardware device, such as a control system, a control circuit or a control computer, and the above-mentioned control unit 800 is not limited to be on the base 200 or at a side of the base 200. However, the disclosure is not limited thereto.

Although the disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. An automated key pressing device, comprising:
   a loading stage configured to load a keyboard of an electronic device;
   a base located at one side of the loading stage;
   a transmission module reciprocatedly slidable on the base;
   at least one first key pressing module disposed on the transmission module, and extending outwardly towards the loading stage from the transmission module for pressing one of keys of the keyboard, the at least one first key pressing module comprising a pivoting base located on the transmission module; an extending arm pivotally connected to the pivoting base, and one end of the extending arm is formed with a key pressing portion; an electromagnetic component disposed between the pivoting base and the extending arm, for switchably magnetically attracting the extending arm; and an elastic member connected to the pivoting base and the extending arm, wherein, when the electromagnetic component magnetically attracts the extending arm to rotate the extending arm, the extending arm presses the one of the keys of the keyboard through the key pressing portion;
   at least one second key pressing module disposed on the base, and extending outwardly towards the loading stage from the base for pressing another of the keys of the keyboard; and
   a control unit electrically connected to the electromagnetic component of the at least one first key pressing module, the at least one second key pressing module and the transmission module,
   wherein comparing to the at least one second key pressing module, the at least one first key pressing module is more prominently extended above the loading stage.

2. The automated key pressing device of claim 1, wherein the transmission module comprises:
   two platforms located oppositely on the base;
   two pulleys respectively pivoted on the platforms;
   at least one guiding post located between the platforms and disposed across the platforms;
   a carrier slidably disposed on the at least one guiding post for carrying the at least one first key pressing module;
   a moving belt sleeved on the pulleys, and fixedly connected to the carrier for traveling with the rotation of the pulleys; and
   a step motor coaxially connected to one of the pulleys and electrically connected to the control unit for reciprocating the carrier.

3. The automated key pressing device of claim 1, wherein the at least one second key pressing module is plural, and the second key pressing modules are fixedly arranged abreast on the base for pressing a few of the keys of a same key row of the keyboard, respectively.

4. The automated key pressing device of claim 1, further comprising:
   at least one third key pressing module disposed on the base, and extending outwardly towards the loading stage from the base in a first direction for pressing one another of the keys of the keyboard,
   wherein both of the first key pressing module and the second key pressing module extend towards the loading stage in a second direction which is intersected with the first direction.

5. The automated key pressing device of claim 1, further comprising:
   a support bracket connected to the base; and
   an image capturing device suspended and mounted on the support bracket, and electrically connected to the control unit for capturing images of at least one of a display screen of the electronic device and the keyboard of the electronic device.

6. The automated key pressing device of claim 1, wherein the loading stage further comprising:
   a bottom plate formed with a first guiding rail; and
   a moving plate formed with a second guiding rail for carrying the electronic device,
   wherein the moving plate is slidably disposed on the bottom plate through the first guiding rail being slidably engaged with the second guiding rail.

7. An automated key pressing device, comprising:
   a base having a test area for placing a keyboard therein, wherein the keyboard has a plurality of key rows which are parallel to each other;
   a plurality of key pressing modules arranged abreast on the base along a long axis of the base, and respectively extending outwardly into the test area from the base, wherein lengths of the key pressing modules extending into the test area are incrementally increased along a direction respectively for pressing at least different two of the key rows of the keyboard respectively; and
   a control unit configured to respectively trigger the key pressing modules to press the keyboard.

8. An automated key pressing device, comprising:
   a loading stage configured to load a keyboard of an electronic device;
   a base located at one side of the loading stage;
   a transmission module reciprocatedly slidable on the base;
   at least one first key pressing module disposed on the transmission module, and extending outwardly towards the loading stage from the transmission module for pressing one of keys of the keyboard, and the at least one first key pressing module comprising a servo motor located on the transmission module, and electrically connected to the control unit; a rod coaxially coupled to a rotary shaft of the servo motor; and a cam coaxially connected to the rod for pressing the one of the keys of the keyboard by the servo motor, and the cam comprising a main body coaxially coupled to the rod; and a protrusive portion formed on a circumferential surface of the main body, wherein, when the servo motor rotates the cam by one of different rotation angles, the cam is rotated to press the one of the keys through one of the main body and the protrusive portion so that the one of the keys is pressed down by one of two different declining distances;

at least one second key pressing module disposed on the base, and extending outwardly towards the loading stage from the base for pressing another of the keys of the keyboard; and a control unit electrically connected to the servo motor of the at least one first key pressing module, the at least one second key pressing module and the transmission module, wherein comparing to the at least one second key pressing module, the at least one first key pressing module is more prominently extended above the loading stage.

9. The automated key pressing device of claim 8, wherein the transmission module comprises:
two platforms located oppositely on the base;
two pulleys respectively pivoted on the platforms;
at least one guiding post located between the platforms and disposed across the platforms;
a carrier slidably disposed on the at least one guiding post for carrying the at least one first key pressing module;
a moving belt sleeved on the pulleys, and fixedly connected to the carrier for traveling with the rotation of the pulleys; and
a step motor coaxially connected to one of the pulleys and electrically connected to the control unit for reciprocating the carrier.

10. The automated key pressing device of claim 8, wherein the at least one second key pressing module is plural, and the second key pressing modules are fixedly arranged abreast on the base for pressing a few of the keys of a same key row of the keyboard, respectively.

11. The automated key pressing device of claim 8, further comprising:
at least one third key pressing module disposed on the base, and extending outwardly towards the loading stage from the base in a first direction for pressing one another of the keys of the keyboard,
wherein both of the first key pressing module and the second key pressing module extend towards the loading stage in a second direction which is intersected with the first direction.

12. The automated key pressing device of claim 8, further comprising:
a support bracket connected to the base; and
an image capturing device suspended and mounted on the support bracket, and electrically connected to the control unit for capturing images of at least one of a display screen of the electronic device and the keyboard of the electronic device.

13. The automated key pressing device of claim 8, wherein the loading stage further comprising:
a bottom plate formed with a first guiding rail; and
a moving plate formed with a second guiding rail for carrying the electronic device,
wherein the moving plate is slidably disposed on the bottom plate through the first guiding rail being slidably engaged with the second guiding rail.

\* \* \* \* \*